(12) United States Patent
Koseki

(10) Patent No.: US 8,669,631 B2
(45) Date of Patent: Mar. 11, 2014

(54) SOLID STATE IMAGING DEVICE HAVING A BACK SURFACE IMPURITY LAYER

(75) Inventor: Yoshiteru Koseki, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 407 days.

(21) Appl. No.: 13/049,277

(22) Filed: Mar. 16, 2011

(65) Prior Publication Data

US 2011/0234893 A1 Sep. 29, 2011

(30) Foreign Application Priority Data

Mar. 24, 2010 (JP) ................................. 2010-068360

(51) Int. Cl.
- *H01L 31/0203* (2006.01)
- *H01L 31/0232* (2006.01)
- *H01L 31/06* (2012.01)

(52) U.S. Cl.
USPC ........... 257/434; 257/432; 257/435; 257/461; 257/E31.121; 257/E31.122; 257/E31.123; 257/E33.076; 257/E33.077

(58) Field of Classification Search
USPC .................. 257/432, 434, 435, 461, E31.121, 257/E31.122, E31.123, E33.076, E33.077
See application file for complete search history.

(56) References Cited

U.S. PATENT DOCUMENTS

| | | | |
|---|---|---|---|
| 6,332,669 B1 * | 12/2001 | Kato et al. | 347/54 |
| 6,355,950 B1 * | 3/2002 | Livengood et al. | 257/276 |
| 6,882,045 B2 * | 4/2005 | Massingill et al. | 257/724 |
| 7,180,019 B1 * | 2/2007 | Chiou et al. | 200/61.45 R |
| 7,221,051 B2 * | 5/2007 | Ono et al. | 257/704 |
| 7,821,085 B2 * | 10/2010 | Suzuki et al. | 257/417 |
| 7,884,437 B2 * | 2/2011 | Minamio et al. | 257/432 |
| 8,013,350 B2 * | 9/2011 | Itoi et al. | 257/98 |
| 8,063,462 B2 * | 11/2011 | Tanida et al. | 257/434 |
| 8,080,855 B2 * | 12/2011 | Maruo et al. | 257/432 |
| 8,154,098 B2 * | 4/2012 | Yang | 257/432 |
| 2008/0164553 A1 * | 7/2008 | Lin et al. | 257/434 |
| 2008/0290438 A1 * | 11/2008 | Weng et al. | 257/434 |
| 2009/0050996 A1 * | 2/2009 | Liu et al. | 257/434 |
| 2009/0284631 A1 | 11/2009 | Matsuo et al. | |
| 2010/0108893 A1 * | 5/2010 | Flitsch et al. | 250/361 R |
| 2010/0109114 A1 * | 5/2010 | Izumi | 257/434 |
| 2010/0117181 A1 * | 5/2010 | Kim et al. | 257/432 |
| 2010/0201966 A1 | 8/2010 | Mase et al. | |
| 2010/0244172 A1 * | 9/2010 | Borthakur et al. | 257/435 |
| 2010/0252902 A1 * | 10/2010 | Tanida et al. | 257/433 |
| 2013/0256631 A1 * | 10/2013 | Khan et al. | 257/13 |

* cited by examiner

FOREIGN PATENT DOCUMENTS

| | | |
|---|---|---|
| JP | 2008-130603 | 6/2008 |
| JP | 2009-54605 A | 3/2009 |
| JP | 2009-158863 A | 7/2009 |
| WO | WO 2009/005098 A1 | 1/2009 |

OTHER PUBLICATIONS

Japanese Office Action Issued Jul. 17, 2012 in Patent Application No. 2010-068360 (with English translation).

*Primary Examiner* — Ida M Soward

(74) *Attorney, Agent, or Firm* — Oblon, Spivak, McClelland, Maier & Neustadt, L.L.P.

(57) ABSTRACT

A solid state imaging device according to one embodiment of the present invention includes a substrate with a solid state imaging element, a first impurity layer, a plurality of external electrodes, and a translucent substrate. The first impurity layer is formed on a back surface side of the substrate, and forms a pn junction with the substrate. The plurality of external electrodes is formed on the back surface of the substrate and is electrically connected to the solid state imaging element. The translucent substrate is fixed to the substrate.

12 Claims, 9 Drawing Sheets

SOLID STATE IMAGING DEVICE HAVING A BACK SURFACE IMPURITY LAYER

CROSS REFERENCE TO RELATED APPLICATIONS

This application is based upon and claims the benefit of priority from the prior Japanese Patent Application No. 2010-068360 filed in Japan on Mar. 24, 2010; the entire contents of which are incorporated herein by reference.

FIELD

Embodiments described herein relate generally to a solid state imaging device, a camera module, and a method for manufacturing the solid state imaging device.

BACKGROUND

A chip scale camera module (CSCM) is known for a compact camera module used in portable telephones, and the like. The CSCM has a lens holder, in which a lens is directly incorporated inside, fixed on a solid state imaging device in a focused state with an adhesive applied onto the solid state imaging device.

The solid state imaging device includes a thinned silicon substrate having a sensor chip at a central part of the front surface, and a glass substrate fixed on the silicon substrate. External electrodes are formed on the back surface of the silicon substrate. The external electrodes are electrically connected to the sensor chip through a through-electrode formed on the silicon substrate using the TSV (Through Silicon Via) technique. The CSCM is mounted on a mounting substrate through the external electrodes.

However, a gap is formed between the mounting substrate and the back surface of the solid state imaging device when the CSCM is mounted on the mounting substrate. The light reflected at the front surface of the mounting substrate thus passes through the gap and enters the back surface of the solid state imaging device. The silicon substrate of the solid state imaging device has a property of transmitting infrared light. Therefore, the infrared light component of the light that entered the back surface of the solid state imaging device is transmitted through the silicon substrate and reaches the sensor chip. The infrared light is received by the sensor chip as a noise component. Therefore, the image output from the CSCM degrades.

DESCRIPTION OF THE EMBODIMENTS

A solid state imaging device according to one embodiment of the present invention includes a substrate with a solid state imaging element, a first impurity layer, a plurality of external electrodes, and a translucent substrate. The first impurity layer is formed on the back surface side of the substrate and forms a pn junction with the substrate. The plurality of external electrodes is formed on the back surface of the substrate and is electrically connected to the solid state imaging element. The translucent substrate is fixed on the substrate.

A camera module according to one embodiment of the present invention includes the solid state imaging device, a tubular lends holder, and a tubular shield. The lens holder is formed on the solid state imaging device, internally includes a lens and has a bottom. The shield is fixed to the lens holder so as to cover one part of the lens holder and the solid state imaging device, has a bottom, and has an opening at the bottom.

The method for manufacturing the solid state imaging device according to one embodiment of the present invention includes the steps of forming a first impurity layer, forming a plurality of through-holes, forming an insulating film, forming a plurality of wirings, and forming a plurality of external electrodes. The step of forming the first impurity layer is a step of forming the first impurity layer, which forms the pn junction with the substrate, on the back surface side of the substrate by injecting ions to the back surface of the substrate including the solid state imaging element. The step of forming a plurality of through-holes is a step of forming a plurality of through-holes in the substrate. The step of forming the insulating film is a step of forming the insulating film on the back surface of the substrate and the side surfaces of the plurality of through-holes. The step of forming a plurality of wirings is a step of forming a plurality of wirings to be connected to the solid state imaging element on the front surface of the insulating film. The step of forming a plurality of external electrodes is a step of forming a plurality of external electrodes, each of which is to be connected to one part of the plurality of wirings, on the back surface of the substrate.

The solid state imaging device, the camera module, and the method for manufacturing the solid state imaging device according to some embodiments of the present invention will be hereinafter described in detail with reference to the drawings.

First Embodiment

Figure 1:
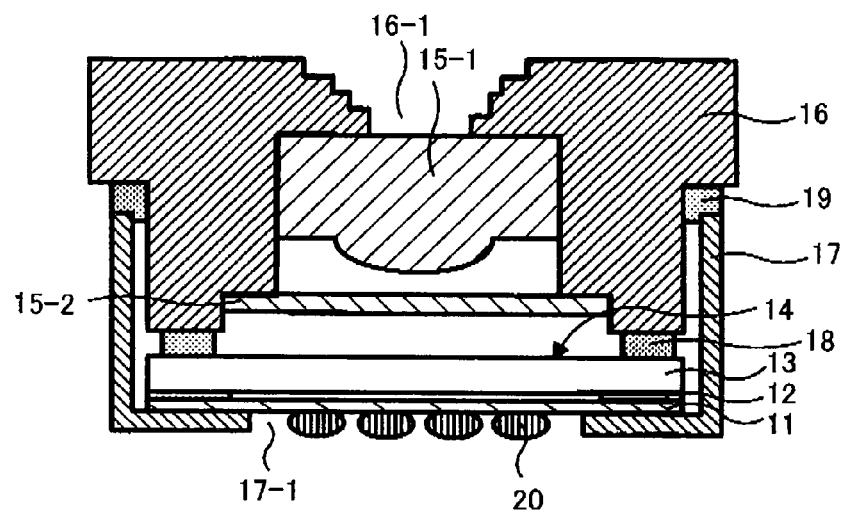
FIG. 1 is a cross-sectional view showing a camera module according to a first embodiment.

FIG. 1 is a vertical cross-sectional view of a camera module according to a first embodiment. As shown in FIG. 1, the camera module has a solid state imaging device 14 and a lens holder 16 internally including a lens 15-1 covered with a shield 17. The solid state imaging device 14 includes a silicon substrate 11, and a supporting substrate 13 fixed on the silicon substrate 11 through a first adhesive 12 formed on the silicon substrate 11.

The lens holder 16 is fixed on the solid state imaging device 14. The lens holder 16 is made of a tubular resin having a bottom. An opening 16-1 is formed at the bottom of the lens holder 16, and the lens 15-1 and an infrared light cut filter 15-2 are respectively arranged in the lens holder 16.

The lens holder 16 is fixed on the solid state imaging device 14 by a second adhesive 18 annularly formed on the front surface of the solid state imaging device 14. The lens holder 16 is fixed at a position where the focus of the lens 15-1 coincides with a solid state imaging element 23, to be described later. Therefore, the light entered from the opening 16-1 at the bottom of the lens holder 16 is collected by the lens 15-1 and received by the solid state imaging device 14 (solid state imaging element 23).

The shield 17 that covers the solid state imaging device 14 and the lens holder 16 are made of a tubular metal having a bottom. The shield 17 is fixed to the lens holder 16 by a third adhesive 19 formed at the side surface of the lens holder 16. The bottom of the shield 17 is arranged on the back surface of the solid state imaging device 14. The bottom of the shield 17 has an opening 17-1. A plurality of external electrodes 20 arranged at the back surface of the solid state imaging device 14 is exposed from the opening 17-1 at the bottom of the shield 17.

Figure 2:
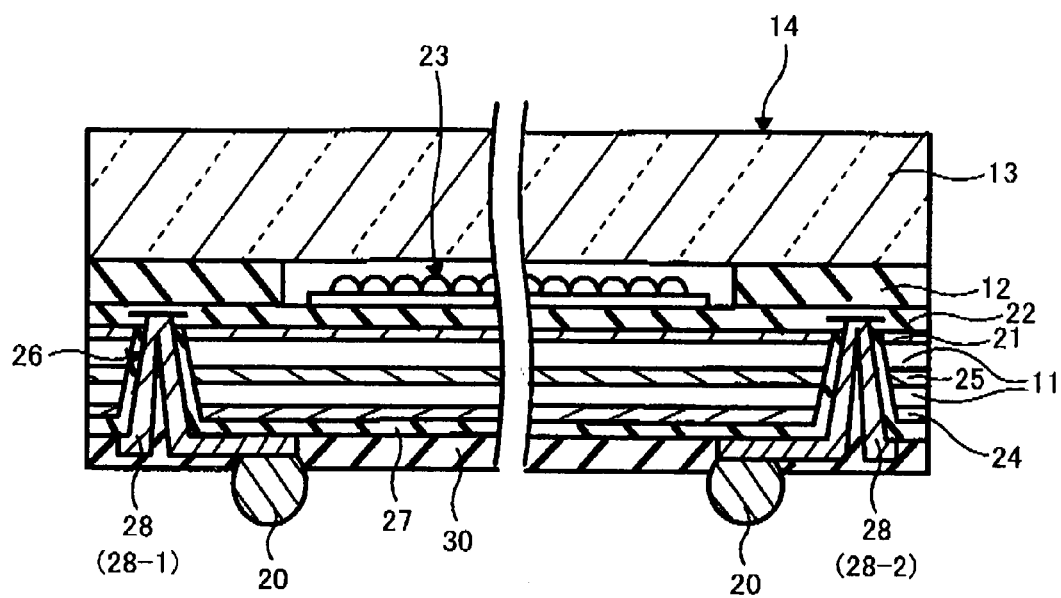
FIG. 2 is a cross-sectional view showing a solid state imaging device to be applied to the camera module of FIG. 1.

FIG. 2 is a cross-sectional view showing, in an enlarged manner, the solid state imaging device 14 of FIG. 1. As shown in FIG. 2, the solid state imaging device 14 includes the silicon substrate 11 and the supporting substrate 13. The supporting substrate 13 is fixed on the silicon substrate 11 through the first adhesive 12 annularly formed on the silicon substrate 11. The supporting substrate 13 is a translucent substrate such as glass substrate.

The silicon substrate 11 is thinned to about 70 µm to 100 µm, for example. The first adhesive 12 has a thickness of about 10 µm to 50 µm, for example. The supporting substrate 13 has a thickness of about 350 µm to 500 µm, for example.

The silicon substrate 11 has a P-type conductivity, for example. A P-type well layer 21 is formed on the front surface of the silicon substrate 11. A first insulating film 22 made of, for example, $SiO_2$ is formed on the front surface of the silicon substrate 11. The first adhesive 12 is annularly formed on the front surface of the first insulating film 22. The solid state imaging element 23 is formed on the silicon substrate 11 (front surface of first insulating film 22) on the inner side of the annular first adhesive 12. The solid state imaging element 23 has a plurality of imaging elements (not shown) arrayed in a lattice form, where each imaging element includes a photodiode for photoelectric conversion, a color filter, a microlens, and the like.

A plurality of external electrodes 20 electrically connected to the solid state imaging element 23 is formed on the back surface of the silicon substrate 11. The external electrode 20 is a solder ball, for example. These are formed at two areas in FIG. 1, but the number of the plurality of external electrodes 20 is not limited.

A first impurity layer 24 is formed on the back surface of the silicon substrate 11. A back surface of the first impurity layer 24 is exposed from the back surface of the silicon substrate 11. The first impurity layer 24 is an amorphous layer formed by accelerating, for example, germanium (Ge) ions at about a few MeV to inject the ions to the back surface of the silicon substrate 13. The first impurity layer 24 is formed deep to an extent that the infrared light component of the light entered from the back surface of the silicon substrate 11 can be absorbed.

For example, if the first impurity layer 24 is formed by injecting germanium (Ge) ions to the P-type silicon substrate 11, the photodiode is formed because the N-type impurity layer 24 and the P-type silicon substrate 11 on the layer 24 form pn junction. Therefore, the infrared light component of the light entered to the back surface of the silicon substrate 11 is absorbed by the photodiode configured by the first impurity layer 24 and the silicon substrate 11. The absorbed infrared light component is converted to current and flows to the outside of the device through the grounded external electrode 20.

A second impurity layer 25 is formed inside the silicon substrate 11 at a position spaced apart from the first impurity layer 24. The second impurity layer 25 is formed above the first impurity layer 24. The second impurity layer 25 is an impurity layer formed by accelerating, for example, boron (B) ions at about a few MeV to inject ions to the back surface of the silicon substrate 13.

For instance, if the second impurity layer 25 is formed by injecting boron (B) ions to the P-type silicon substrate 11, the photodiode is formed because the N-type impurity layer 25 and the P-type silicon substrate 11 on the layer 25 form pn junction. Therefore, the infrared light transmitted through the first impurity layer 24 of the infrared light component of the light entered to the back surface of the silicon substrate 11 is absorbed by the photodiode configured by the second impurity layer 25 and the silicon substrate 11. The absorbed infrared light component is converted to current and flows to the outside of the device through the grounded external electrode 20.

The second impurity layer 25 does not necessarily need to be formed, and only needs to be arranged when the suppression of transmissive amount of the infrared light and the suppression of image degradation are desired to be more efficiently carried out.

A plurality of through-holes 26 that pass through the silicon substrate 11 is formed in the silicon substrate 11 including the first impurity layer 24. A second insulating film 27 made of, for example, $SiO_2$ and the like is formed at the back surface of the silicon substrate 11 and the inner side surface of the through-hole 26.

A first wiring 28 made of, for example, Cu is formed on the front surface of the second insulting film 27 arranged on the inner side surface of the through-hole 26. The first wiring 28 includes a power supply or signal retrieving wiring 28-1 for supplying power to the solid state imaging element 23 or retrieving signals from the solid state imaging device, and a GND wiring 28-2 for grounding (hereinafter expressed as GND) the solid state imaging element 23. In FIG. 2, the first wiring 28 on the left side in the figure is the power supply or signal retrieving wiring 28-1, and the wiring 28 on the right side in the figure is the GND wiring 28-2.

The respective one ends of the first wirings 28 are connected to one of a plurality of wirings in the first insulating film 22 to be described later, and the respective other ends are formed to extend to the back surface of the silicon substrate 11.

A solder resist film 30 as a wiring protective layer is formed on the front surface of the second insulating film 27 including the first wiring 28. The solder resist film 30 is also formed inside the through-hole 26.

The solder resist film 30 is formed so that one part of the first wiring 28 is exposed. The external electrode 20 is formed on each first wiring 28 exposed from the solder resist film 30.

Figure 3:
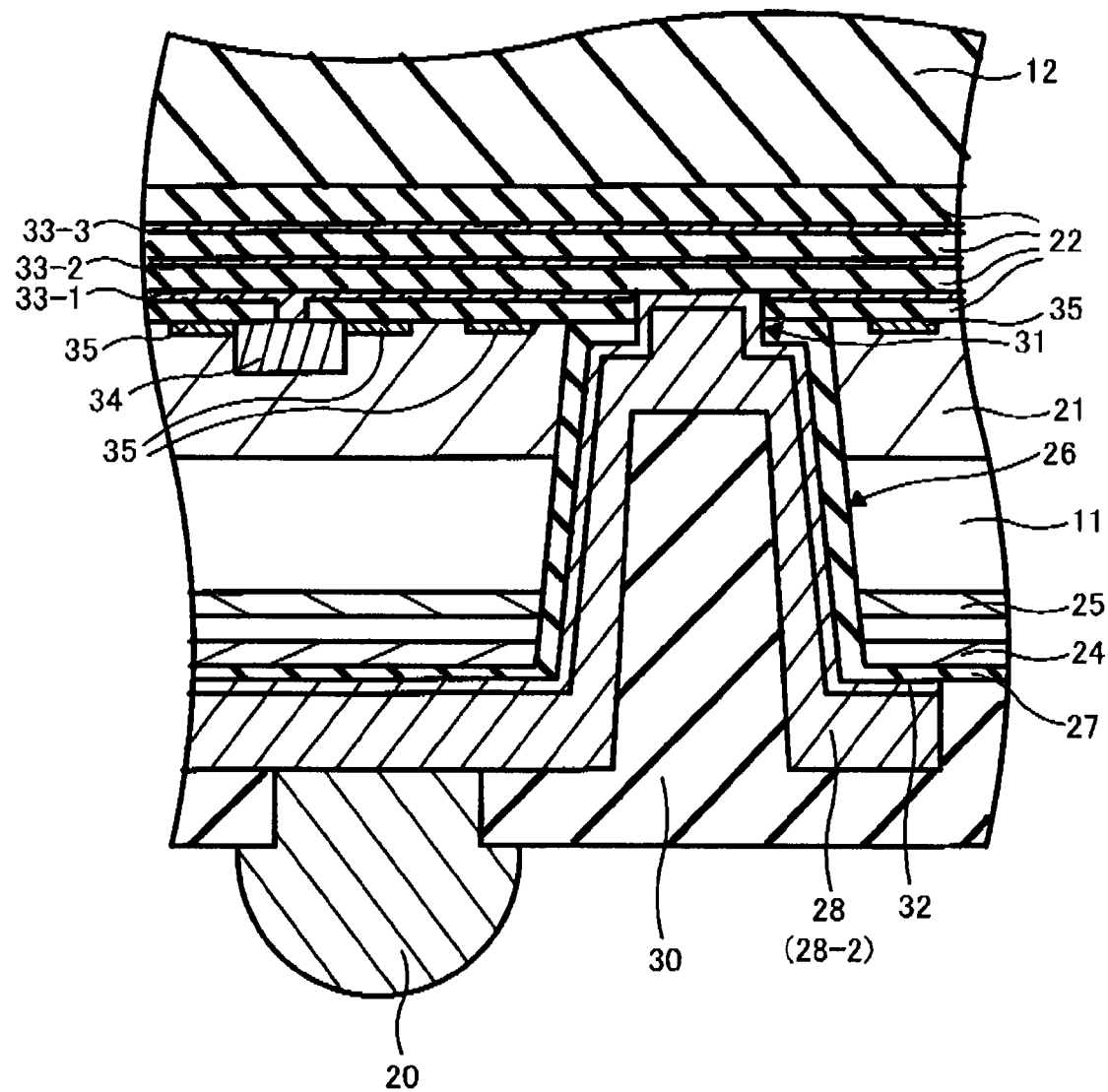
FIG. 3 is a partial cross-sectional view showing, in an enlarged manner, the vicinity of a through-hole of the solid state imaging device of FIG. 2.

FIG. 3 is a cross-sectional view showing, in an enlarged manner, the vicinity of the through-hole 26 where the GND wiring 28-2 is arranged in the through-hole 26 shown in FIG. 2. As shown in FIG. 3, a plurality of layers of wirings such as a second wiring 33-1, a third wiring 33-2, and a fourth wiring 33-3 is formed in the first insulating film 22. Each wiring 33-1, 33-2, 33-2 is formed by Al and the like. The one end of the wiring 33-1, 33-2, 33-3 is electrically connected to the solid state imaging element 33, and the other end is connected to the first wiring 28 in the through-hole 26. In FIG. 3, for example, the second wiring 33-1 functions as a ground wiring, where the other end of the second wiring 33-1 is connected to the GND wiring 28-2.

Although the illustration is omitted, the other end of the power supply or signal retrieving wiring 28-1 in each through-hole 26 is connected to either the third or fourth wiring 33-2, 33-3 if the third and fourth wiring 33-2, 33-3 functions as the power supply or signal retrieving wiring.

In FIG. 3, the wiring in the first insulating film 22 includes three layers. However, the wiring in the first insulating film 22 is generally formed to three or more layers. The reason therefor is as follows.

As one example of the solid state imaging element 23, the manufacturing process of the CMOS sensor including a plurality of layers of wirings in the first insulating film 22 has high compatibility with the manufacturing process of a logic circuit. Therefore, the CMOS sensor including a plurality of layers of wirings in the first insulating film 22 and the logic circuit are usually formed to be included in the same chip. The logic circuit is normally configured by multi-layer wirings of three or more layers. Therefore, the wiring in the first insulating film 22 arranged in the CMOS sensor is also configured by multi-layer wirings of three or more layers.

An opening 31 provided by removing one part of the first insulating film 22 and one part of the second wiring 33-1 is formed at the bottom of the through-hole 26. If the third wiring 33-2 or the fourth wiring 33-3 functions as the GND wiring, the opening 31 may be formed deep until one part of the wirings 33-2, 33-3 is removed. Although not illustrated, the wiring is also formed on the upper layer than the third wiring 33-2, and the opening may be formed deep until one part of such wiring on the upper layer is removed. In other words, the opening 31 only needs to be formed until one part of the wiring to be connected to the first wiring 28 of a plurality of layers of wirings formed in the first insulating film 22 is removed.

The GND wiring 28-2 is formed on the side surface of the through-hole 26 and in the opening 31. If the first wiring 28 including the GND wiring 28-2 is formed by plating method, the GND wiring 28-2 (first wiring 28) includes a plating electrode 32 formed at the side surface of the through-hole 26 and in the opening 31.

A P-type high concentration impurity layer 34 for grounding the silicon substrate 11 is formed on the front surface of the silicon substrate 11. The impurity layer 34 is a contact layer for electrically conducting the second wiring 33-1 and the silicon substrate 11. In other words, the silicon substrate 11 is connected to the second wiring 33-1 through the impurity layer 34.

An element separation layer 35 is formed at the periphery of the impurity layer 34 and the periphery of the through-hole 26 of the front surface of the silicon substrate 11. The element separation layer 35 has an STI structure, for example. In other words, the element separation layer 35 is formed by scraping the silicon substrate 11 to a recess shape, and embedding the insulating film of $SiO_2$ and the like into the scraped region.

When the camera module described above is irradiated with light including the infrared light from the back surface of the silicon substrate 11, the infrared light is absorbed by the photodiode formed because the first impurity layer 24 and the silicon substrate 11 on the layer 24 form pn junction, and also by the photodiode formed because the second impurity layer 25 and the silicon substrate 11 on the layer 25 form pn junction, and then converted to current through photoelectric conversion. The converted current flows to the second wiring 33-1 through the P-type impurity layer 39, and then flows to the outside of the camera module through the GND wiring 28-2 and the external electrode 20.

The method for manufacturing the camera module, in particular, the method for manufacturing the solid state imaging device 19 used in the camera module will now be described with reference to FIGS. 4 to 11. FIGS. 4 to 11 are cross-sectional views corresponding to FIG. 2 and showing the manufacturing process of the solid state imaging device 14.

The method for manufacturing the solid state imaging device 14 is a method of collectively forming, on the silicon wafer, a plurality of solid state imaging devices 14 in a lattice form, and ultimately individualizing the same by dicing. In the following description, the method for manufacturing one solid state imaging device 19 on the silicon wafer will be described. Therefore, the silicon substrate 11 shown in FIGS. 2 and 3 is referred to as a silicon wafer 11 in the following description of the manufacturing method.

First, the well layer 21 is formed on the silicon wafer 11. Next, the desired ions are injected to the silicon wafer 11 at an acceleration voltage of the ions of, for example, about 50 to 100 keV to form a photodiode, and then the solid state imaging element 23 including such photodiode is formed. Next, the first insulating film 22 including wirings 33-1, 33-2, 33-3 is formed on the silicon wafer 11. The first adhesive 12 is annularly formed on the first insulating film 22 so as to surround the solid state imaging element 23. The annular first adhesive 12 is formed by applying the adhesive 12 uniformly over the silicon wafer 11, and then removing the adhesive 12 on the solid state imaging element 23 and at the periphery thereof through the exposure and developing processes.

The supporting substrate 13 is then laminated on the silicon wafer 11 through the first adhesive 12. The supporting substrate 13 functions as a supporting substrate used when thinning the silicon wafer 11 from the back surface in the next process shown in FIG. 4.

Figure 4:
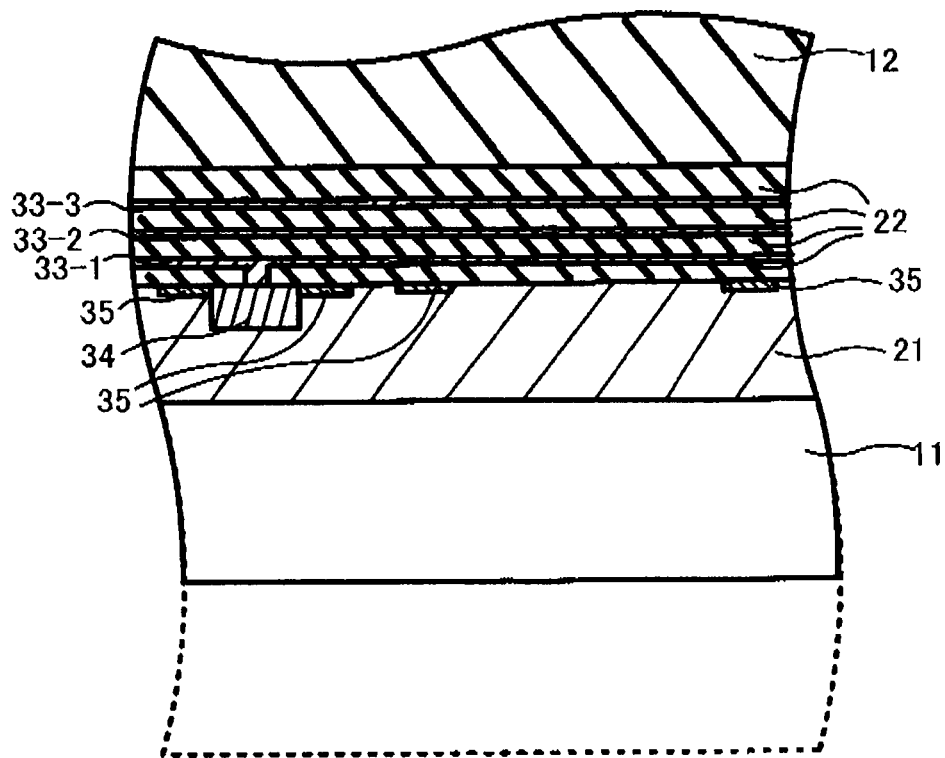
FIG. 4 is a cross-sectional view corresponding to FIG. 2 and showing the process of thinning a silicon substrate of the solid state imaging device of FIG. 2.

As shown in FIG. 4, the silicon wafer 11 is thinned from the back surface to about 70 μm to 100 μm. The thinning is carried out by performing thinning through the Back Side Grinding (BSG method), and then polishing the back surface through the Chemical Mechanical Polishing (CMP method).

Figure 5:
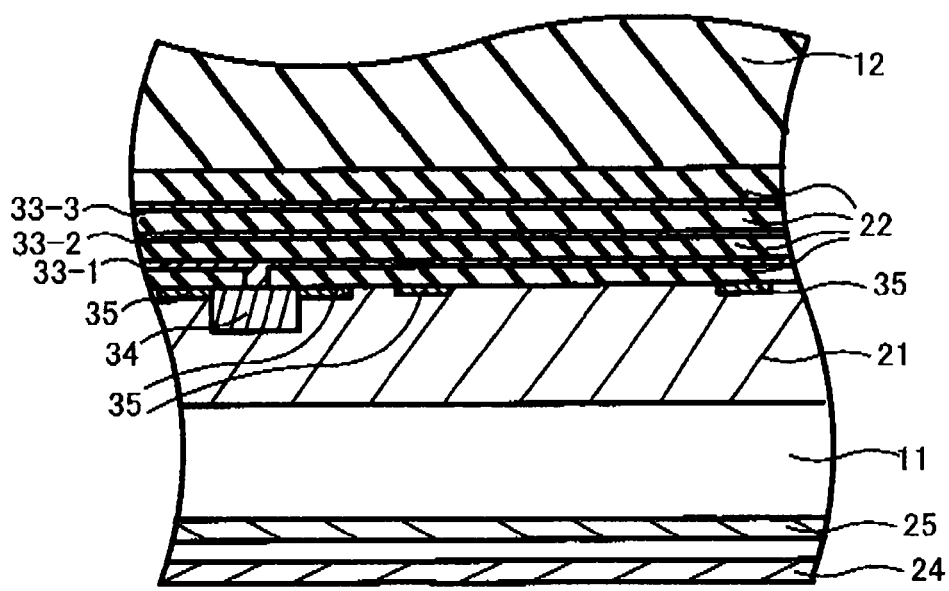
FIG. 5 is a cross-sectional view corresponding to FIG. 2 and showing the manufacturing process of an amorphous layer and a diode layer of the solid state imaging device of FIG. 2.

As shown in FIG. 5, the first impurity layer 24 is formed on the back surface of the silicon wafer 11. Next, the second impurity layer 25 is formed inside the silicon wafer 11.

The first impurity layer 24 is formed by ion injecting germanium (Ge) to the back surface of the silicon wafer 11 under the condition of, for example, the acceleration energy of ions of 2 MeV, and ion injection amount of $5E13/cm^2$. The Si array of the back surface of the silicon wafer 11 is thereby broken to become amorphous by injecting ions under such conditions.

The conditions for forming the first impurity layer 24 are not limited to the above conditions, and the acceleration energy of the ions and the ion injection amount only need to be an extent that the silicon becomes amorphous.

The second impurity layer 25 is formed by ion injecting boron (B) to the back surface of the silicon wafer 11 under the condition of for example, the acceleration energy of ions of 2 MeV, and ion injection amount of $1E13/cm^2$. The Si array of the silicon wafer 11 is not broken and will not become amorphous even if the ions are injected under such conditions since the mass of the boron ion is light.

The conditions for forming the second impurity layer 25 are also not limited to the above conditions, and the acceleration energy of the ions and the ion injection amount only need to be an extent that the ions can be injected above the first impurity layer 24.

Figure 6:
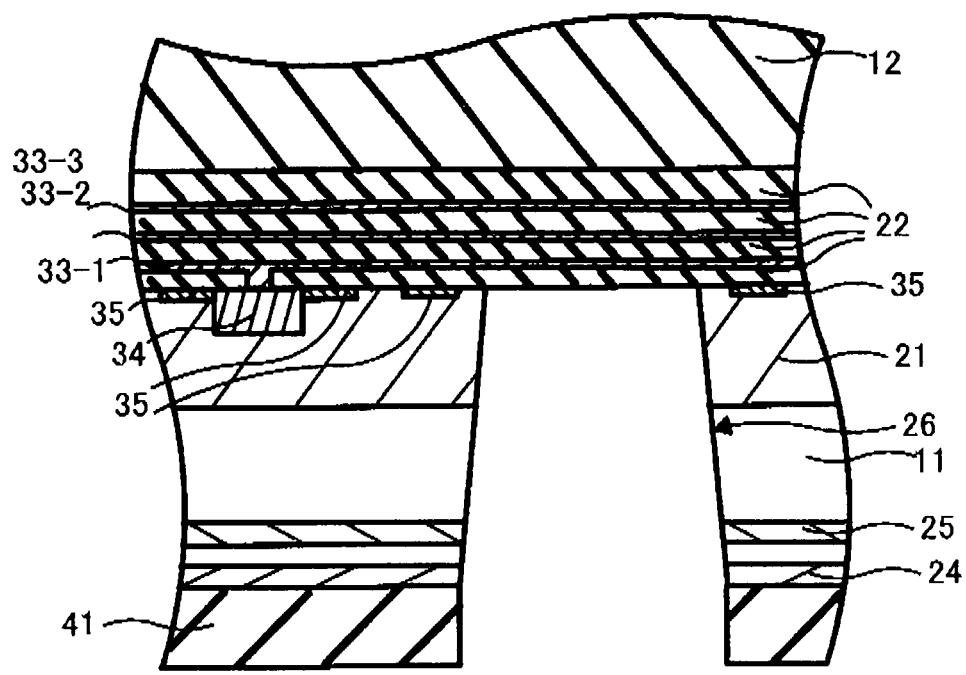
FIG. 6 is a cross-sectional view corresponding to FIG. 2 and showing the process of forming the through-hole in the silicon substrate of the solid state imaging device of FIG. 2.

As shown in FIG. 6, the through-hole 26 passing through the silicon wafer 11 is then formed. The through-hole 26 is formed by forming a resist layer 41, which has an opening in the area to form the through-hole 26, on the back surface of the silicon wafer 11, and etching the silicon wafer 11 by, for example, RIE (Reactive Ion Etching) using the resist layer 41 as the mask.

Figure 7:
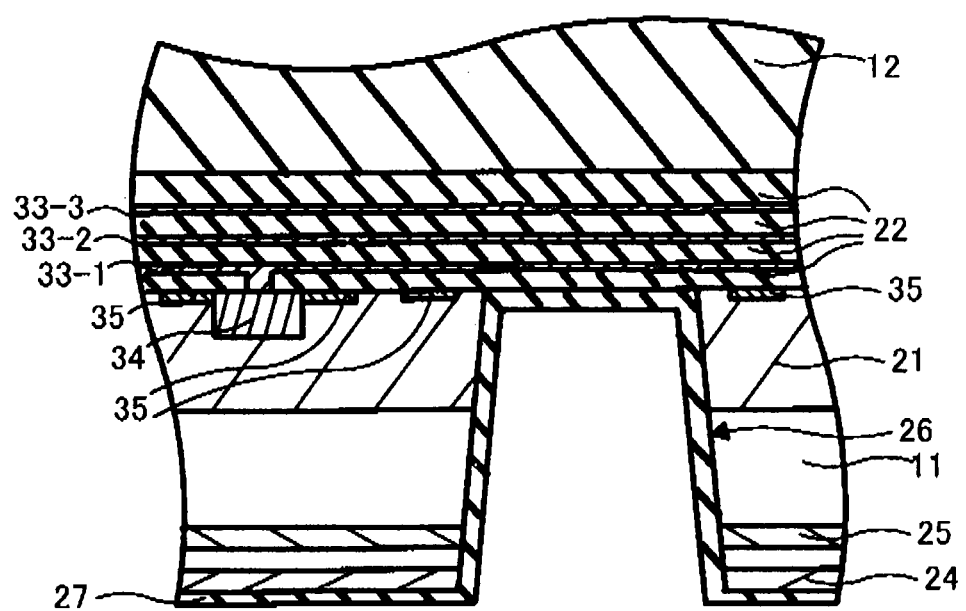
FIG. 7 is a cross-sectional view corresponding to FIG. 2 and showing the process of forming an insulating film on the back surface of the silicon substrate including the through-hole of the solid state imaging device of FIG. 2.

As shown in FIG. 7, the resist layer 41 used in the process of FIG. 6 is removed, and thereafter, the second insulating film 27 made of $SiO_2$ is formed on the back surface of the silicon wafer 11 including the inner side surface of the through-hole 26. The insulating film 27 is formed through, for example, the CVD method.

Figure 8:
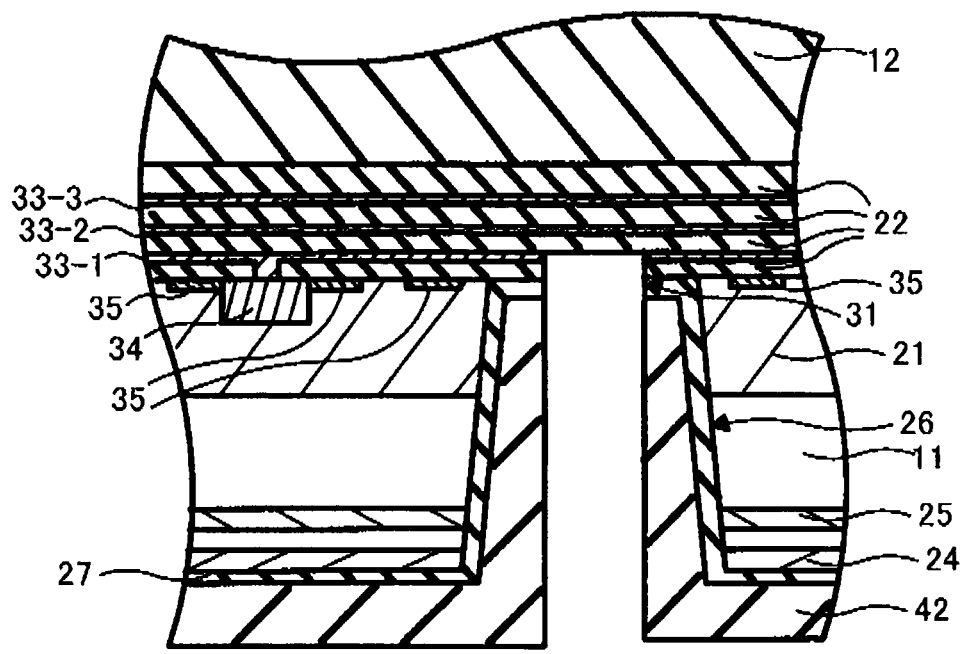
FIG. 8 is a cross-sectional view corresponding to FIG. 2 and showing the process of forming an opening in the through-hole of the solid state imaging device of FIG. 2.

As shown in FIG. 8, an opening 31 that passes through the second insulating film 27, one part of the first insulating film 22, and the second wiring 33-1 is formed at the bottom of the through-hole 26. Similar to the through-hole 26, the opening 31 is also formed by forming a resist layer 42, which has an opening in the area to form the opening 31, and etching the second insulating film 27 and one part of the first insulating film 22, and the second wiring 33-1 by, for example, RIE (Reactive Ion Etching) using the resist layer 42 as the mask.

The GND wiring 28-2 is later arranged in the opening 31 shown in FIG. 8. An opening, in which the power supply or signal retrieving wiring 28-1 is later arranged, is also formed in the other through-hole 26 (not shown) through the above process. Such opening is formed to contact the fourth wiring 33-3, for example. The power supply or signal retrieving wiring 28-1 is also formed at the same time as the illustrated GND wiring 28-2 in the subsequent process, but the description thereof will be omitted here.

Figure 9:
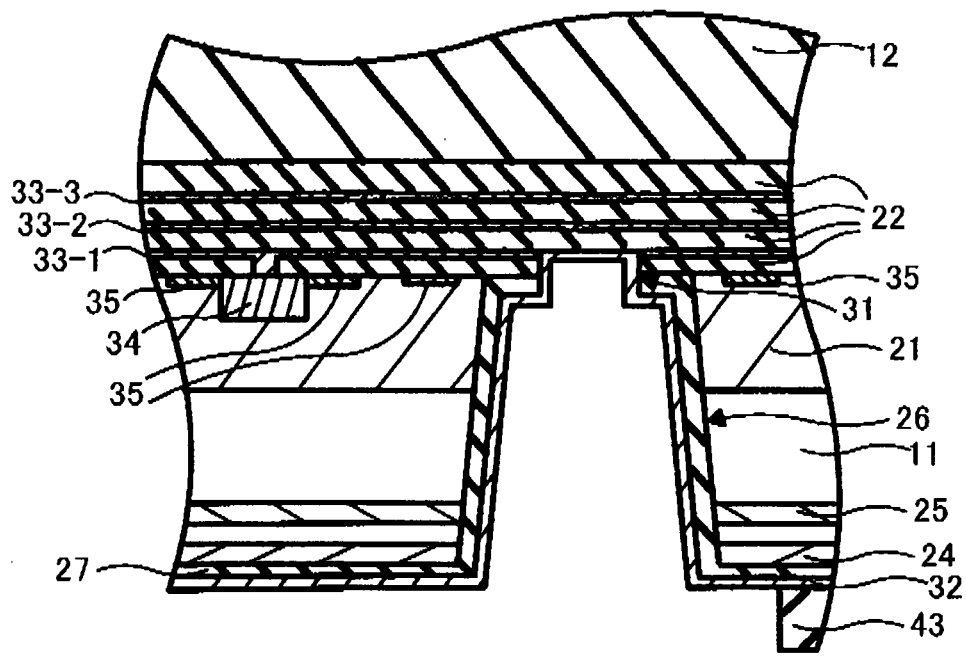
FIG. 9 is a cross-sectional view corresponding to FIG. 2 and showing the process of forming a wiring in the through-hole of the solid state imaging device of FIG. 2.

As shown in FIG. 9, the resist layer 42 used in the process of FIG. 8 is removed, and thereafter, the plating electrode 32 necessary for electrolytic plating is formed on the front surface of the second insulting film 27 and the inner surface of the opening 31. The electrode 32 is formed through the sputtering method.

A resist layer 43 having an opening in the area to form the first wiring 28 (GND wiring 28-2) is further formed on the front surface of the plating electrode 32.

Figure 10:
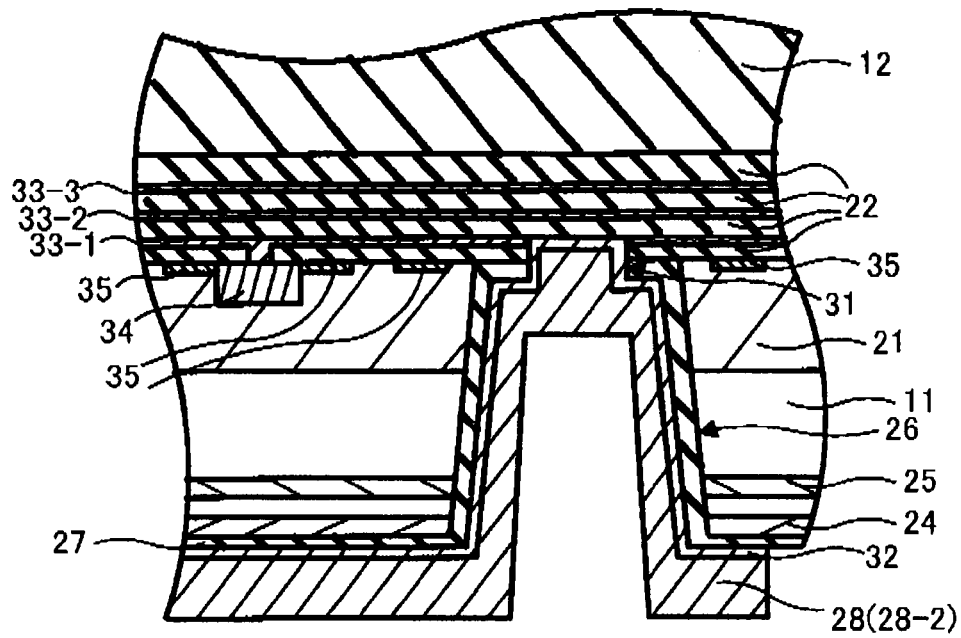
FIG. 10 is also a cross-sectional view corresponding to FIG. 2 and showing the process of forming the wiring in the through-hole.

As shown in FIG. 10, the first wiring 28 (GND wiring 28-2) made of Cu is formed through the electrolytic plating method using the plating electrode 32. Thereafter, the resist layer 43 shown in FIG. 9 is removed, and the plating electrode 32 formed between the resist layer 43 and the silicon wafer 11 is removed through wet etching.

Figure 11:
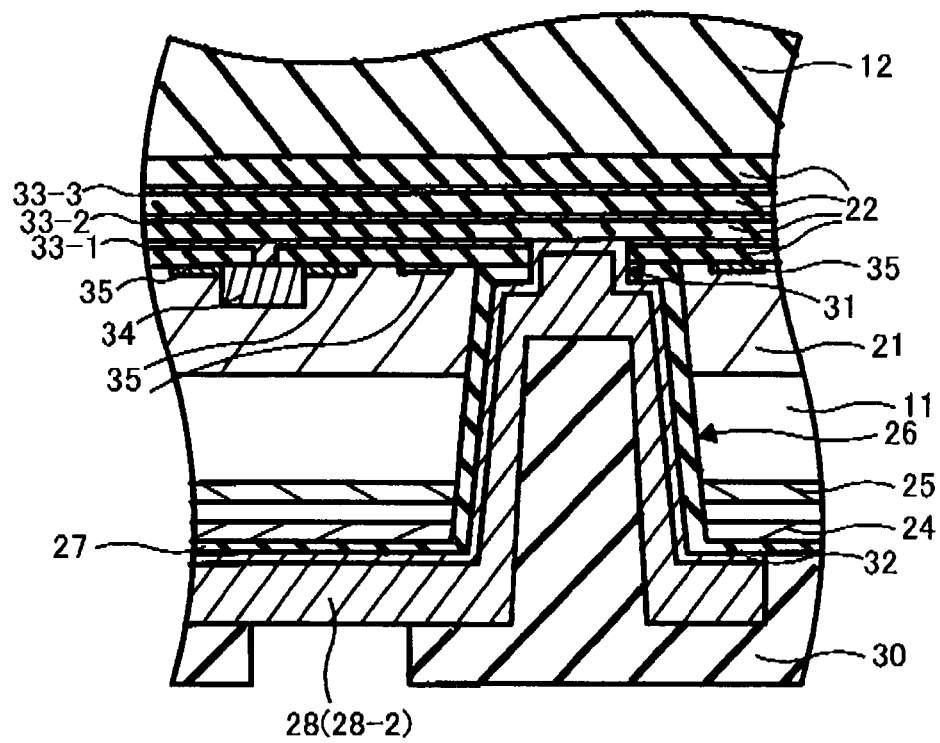
FIG. 11 is a cross-sectional view corresponding to FIG. 2 and showing the process of forming a wiring protective film on the back surface of the silicon substrate of the solid state imaging device of FIG. 2.

As shown in FIG. 11, the solder resist film 30 is formed on the back surface of the silicon wafer 11 including the first wiring 28 (GND wiring 28-2) so as to expose one part of the first wiring 28 (GND wiring 28-2). Here, the solder resist film 30 is formed over the entire back surface of the silicon wafer 11 including the first wiring 28 (GND wiring 28-2), and then one part of the solder resist film 30 is removed using the lithography technique. Thereafter, the solder resist film 30 is cured.

Lastly, the external electrode 20 is mounted on the first wiring 28 (GND wiring 28-2) exposed from the solder resist film 30. A plurality of solid state imaging devices 14 is thereby collectively manufactured. Lastly, the dicing process is carried out to individualize to each solid state imaging device 14 thereby manufacturing the solid state imaging device 14.

Furthermore, the second adhesive 18 is formed on the front surface of the solid state imaging device 14 manufactured in the above manner, and the lens holder 16 is fixed through the second adhesive 18. The second adhesive 18 is cured after adjusting the position of the lens holder 16 so that the focal position of the lens 15-1 in the lens holder 16 coincides with the solid state imaging element 23. Thereafter, the shield 17 is fixed to the lens holder 16 to manufacture the camera module shown in FIG. 1.

According to the camera module described above, the first impurity layer 24 is formed on the back surface of the silicon substrate 11. Therefore, the infrared light component of the light entered from the back surface of the silicon substrate 24 is absorbed by the photodiode formed because the first impurity layer 24 and the silicon substrate 11 form the pn junction. Therefore, the infrared light component of the light entered from the back surface of the silicon substrate 11 can be suppressed from reaching the solid state imaging element 23. As a result, the degradation of the image obtained by the camera module can be suppressed.

Furthermore, the second impurity layer 25 that forms the pn junction with the silicon substrate 11 is formed inside the silicon substrate 11. Therefore, the infrared light component can be further suppressed from reaching the solid state imaging element 23. As a result, the degradation of the image obtained by the camera module can be further suppressed.

Second Embodiment

A camera module according to a second embodiment differs from the camera module according to the first embodiment in the internal structure of the through-hole 26 formed with the GND wiring 28-2. The aspects different from the camera module according to the first embodiment will be hereinafter described with reference to FIG. 12.

Figure 12:
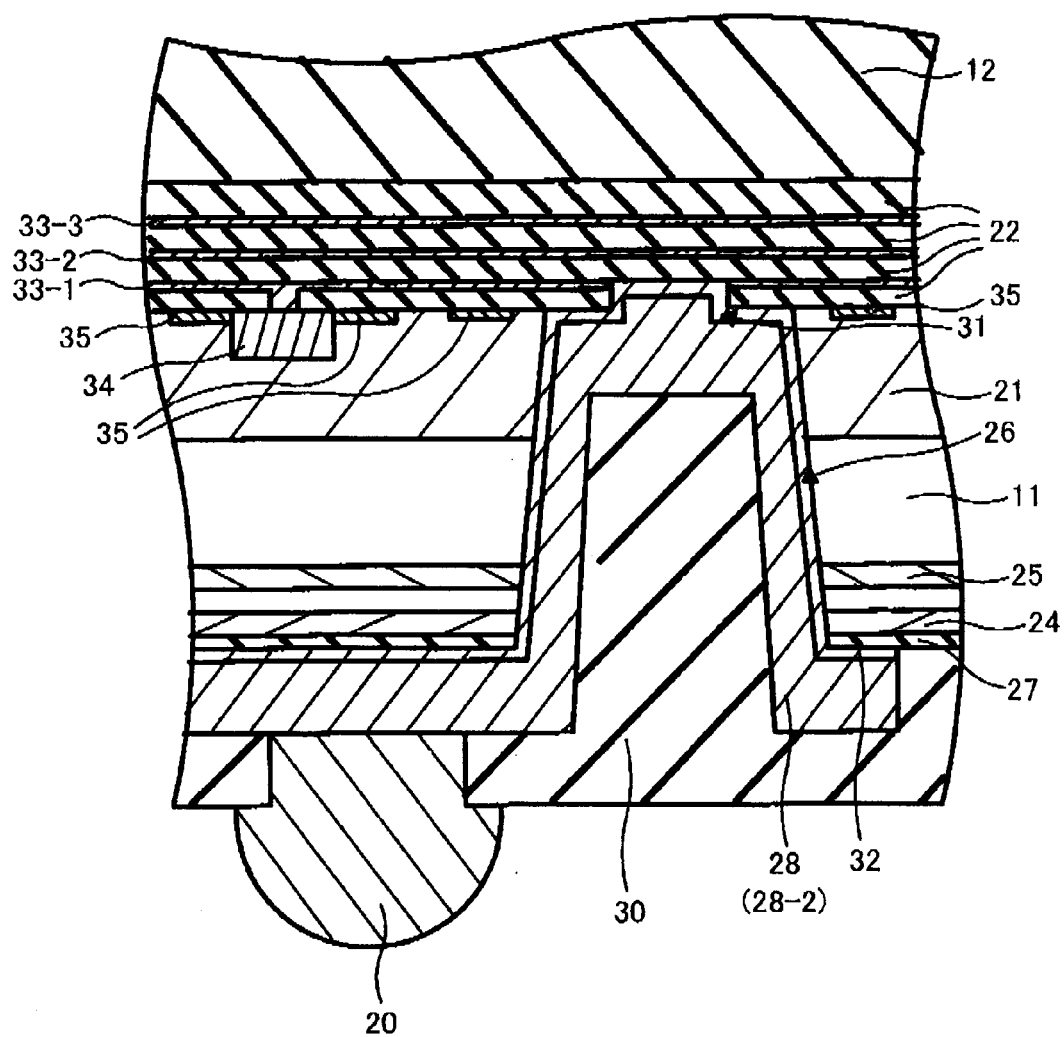
FIG. 12 is a partial cross-sectional view showing, in an enlarged manner, the vicinity of the through-hole of the solid state imaging device used in the camera module according to a second embodiment.

FIG. 12 is a partial cross-sectional view showing, in an enlarged manner, the vicinity of the through-hole 26 of the solid state imaging device 14 used in the camera module according to the second embodiment. As shown in FIG. 12, the solid state imaging device used in the camera module according to the second embodiment differs in that the second insulating film 27 inside the through-hole 26 formed with the GND wiring 28-2 is removed. In other words, the first impurity layer 24 and the second impurity layer 25 are connected to the GND wiring 28-2 formed inside the through-hole 26. The second insulating film 27 inside the through-hole 26 formed with the power supply or signal retrieving wiring 28-1 is not removed.

According to the structure shown in FIG. 12, the current generated by the photoelectric effect in the photodiode formed by the first impurity layer 24 and the silicon substrate 11, and the second impurity layer 25 and the silicon substrate 11 directly flows to the GND wiring 28-2.

Figure 13:
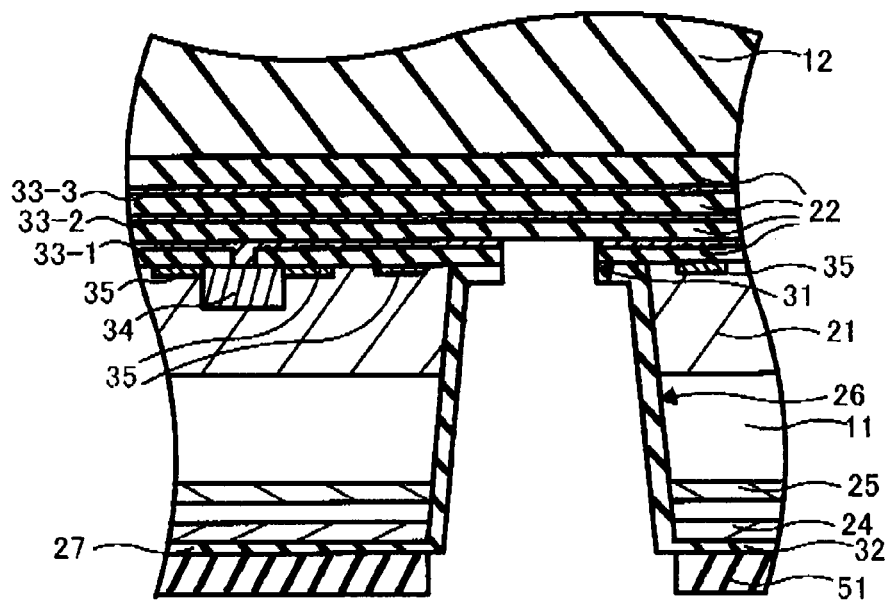
FIG. 13 is a cross-sectional view corresponding to FIG. 12 showing the process of removing the insulating film from inside the through-hole of the solid state imaging device of FIG. 12.

The camera module described above is manufactured in the following manner. In other words, the opening 31 is formed at the bottom of the through-hole 26 and the resist layer 42 is removed as shown in FIG. 8, and thereafter, the resist layer 51 having an opening of an extent of exposing the second insulating film 27 on the inner side surface of the through-hole 26 is formed on the back surface of the silicon wafer 11 so that the opening coincides with the position of through-hole 26, as shown in FIG. 13.

Thereafter, the second insulating film 27 in the through-hole 26 is removed by wet etching using the resist layer 51 as the mask. Subsequently, the resist layer 51 is removed, and the processes similar to those shown in FIGS. 9 to 11 are performed to manufacture the solid state imaging device 14 used in the camera module according to the second embodiment. The second adhesive 18 is formed on the front surface of the solid state imaging device 14 manufactured as above, the lens holder 16 is fixed through the second adhesive 18, and the shield 17 is fixed to the lens holder 16 to manufacture the camera module according to the second embodiment.

The degradation of the image obtained by the camera module can be suppressed even in such camera module since the first impurity layer 24 is formed on the back surface side of the silicon substrate 11. The degradation of the image obtained by the camera module can be further suppressed since the second impurity layer 25 is formed inside the silicon substrate 11.

Furthermore, according to the camera module, the current generated in the photodiode formed by the first impurity layer 24 and the silicon substrate 11, and the second impurity layer 25 and the silicon substrate 11 can directly flow to the outside of the camera module through the GND wiring 28-2 since the GND wiring 28-2 is connected to the first impurity layer 24 and the second impurity layer 25. Normally, a great number of P-type high concentration layers 34 need to be arranged to ground the silicon substrate 11 for the purpose of countermeasures of latch up and the like of the solid state imaging device. However, in the camera module according to the second embodiment, the silicon substrate 11 can be more efficiently grounded than the camera module according to the first embodiment. Therefore, the number of P-type high concentration layers 34 can be reduced, and the area of the solid state imaging device can be reduced.

While certain embodiments have been described, these embodiments have been presented by way of example only, and are not intended to limit the scope of the inventions. Indeed, the solid state imaging device, the camera module, and the method for manufacturing the solid state imaging device described herein may be embodied in a variety of other forms: furthermore, various omissions, substitutions and changes in the form of the solid state imaging device, the camera module, and the method for manufacturing the solid state imaging device described herein may be made without departing from the spirit of the inventions. The accompanying claims and their equivalents are intended to cover such forms or modifications as would fall within the scope and spirit of the inventions.

For instance, the silicon substrate 11 in each embodiment described above is of a P-type conductivity. However, the conductivity of the silicon substrate 11 is not limited, and the N-type silicon substrate may be used. In this case, the well layer is also of N-type, and the impurity layer that becomes the contact layer is also an N-type high concentration layer. Furthermore, the first impurity layer may be formed by injecting ions such as arsenic (As), and the second impurity layer may be formed by injecting ions such as phosphorous (P).

The first impurity layer is formed by ion injecting arsenic (As) ions under the conditions of, for example, the acceleration energy of ions of 2 MeV and the ion injection amount of $5E13/cm^2$.

The second impurity layer is formed by ion injecting phosphorous (P) ions under the conditions of, for example, the acceleration energy of ions of 2 MeV and the ion injection amount of $1E13/cm^2$.

Such conditions are also not limited, similar to the above.

The first impurity layer 24 and the second impurity layer 25 are respectively spaced apart from each other in FIG. 2, but the depth and the thickness at which the layers are formed may be arbitrary and the layers may contact each other. A modification of the solid state imaging devices according to the first and second embodiments will be described below with reference to FIGS. 14 to 16.

Figure 14:
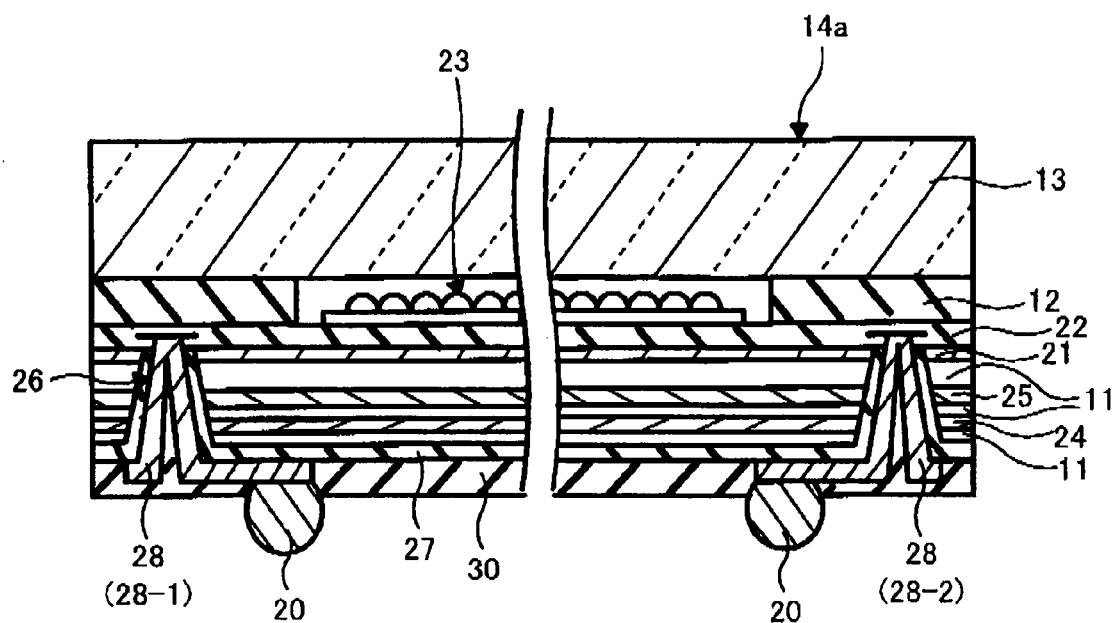
FIG. 14 is a cross-sectional view corresponding to FIG. 2 and showing a first modification of the solid state imaging device of the camera module according to the first and second embodiments.

FIG. 14 is a cross-sectional view corresponding to FIG. 2 and showing a first modification of the solid state imaging devices according to the first and second embodiments. As shown in FIG. 14, the first impurity layer 24 is formed inside the silicon substrate 11 in a solid state imaging device 14a according to the first modification. The first impurity layer 24 is formed at a position spaced apart from the back surface of the silicon substrate 11.

The second impurity layer 25 is formed inside the silicon substrate 11. The second impurity layer 25 is formed at a position spaced apart from the front surface of the first impurity layer 24. The second impurity layer 25 is formed above the first impurity layer 24.

Figure 15:
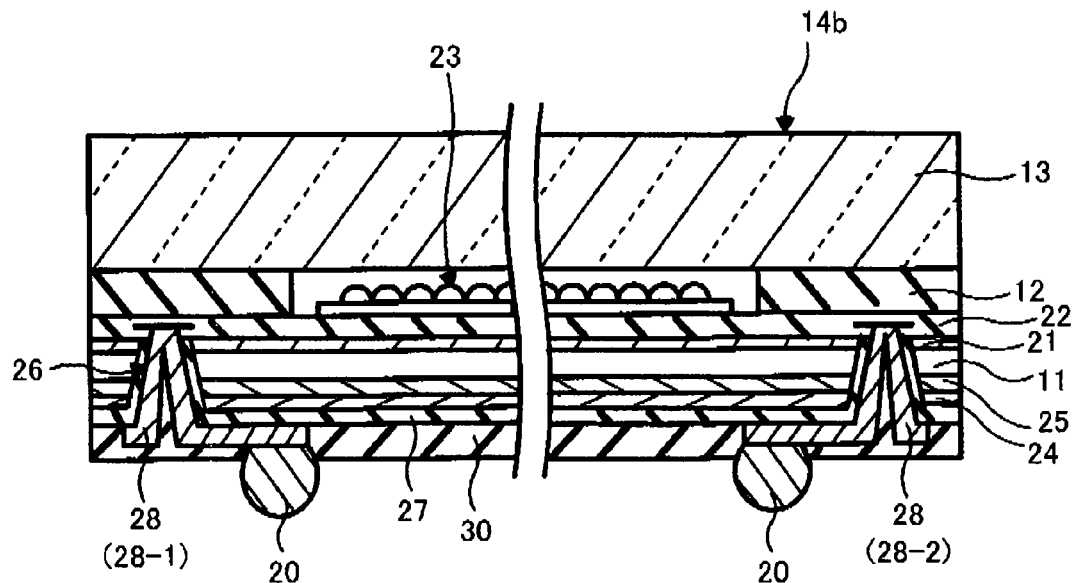
FIG. 15 is a cross-sectional view corresponding to FIG. 2 and showing a second modification of the solid state imaging device of the camera module according to the first and second embodiments.

FIG. 15 is a cross-sectional view corresponding to FIG. 2 and showing a second modification of the solid state imaging devices according to the first and second embodiments. As shown in FIG. 15, the first impurity layer 24 is formed on the back surface of the silicon substrate 11 in a solid state imaging device 14b according to the second modification. A back surface of the first impurity layer 24 is exposed from the back surface of the silicon substrate 11.

The second impurity layer 25 is formed inside the silicon substrate 11. The second impurity layer 25 is formed on the first impurity layer 24.

Figure 16:
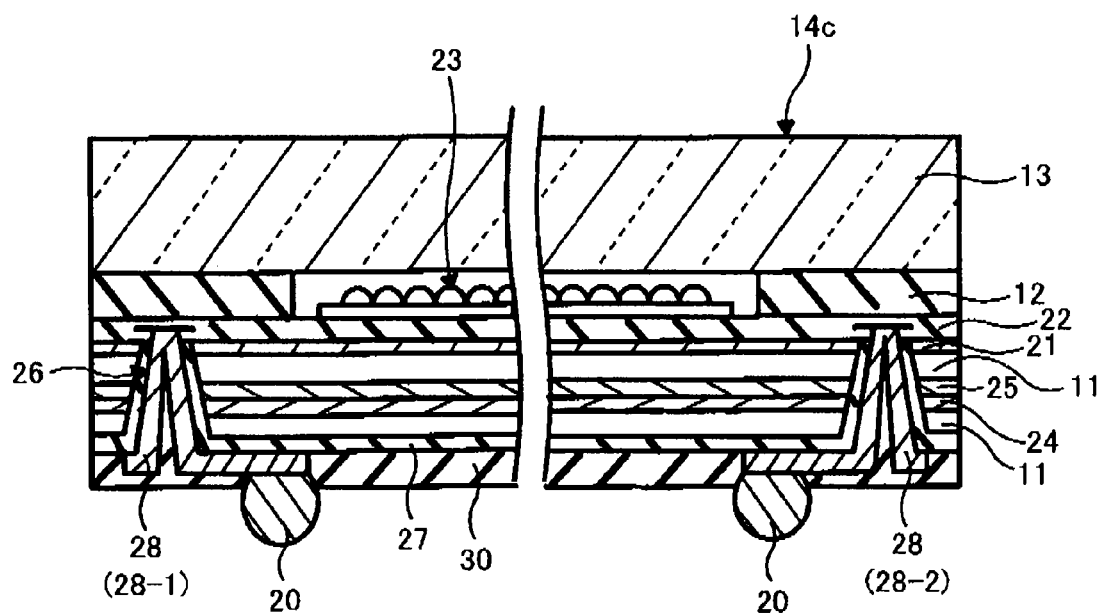
FIG. 16 is a cross-sectional view corresponding to FIG. 2 and showing a third modification of the solid state imaging device of the camera module according to the first and second embodiments.

FIG. 16 is a cross-sectional view corresponding to FIG. 2 and showing a third modification of the solid state imaging devices according to the first and second embodiments. As shown in FIG. 16, the first impurity layer 24 is formed inside the silicon substrate 11 in a solid state imaging device 14c according to the third modification. The first impurity layer 24 is formed at a position spaced apart from the back surface of the silicon substrate 11.

The second impurity layer 25 is formed inside the silicon substrate 11. The second impurity layer 25 is formed on the first impurity layer 24.

The effects similar to the camera modules according to the first and second embodiments can be obtained even with the camera module including the solid state imaging device 14a, 14b, or 14c according to the modifications.

What is claimed is:

1. A solid state imaging device comprising:
a substrate including a solid state imaging element;
a first impurity layer formed on a back surface side of the substrate and forming a pn junction with the substrate;
a plurality of external electrodes formed on the back surface of the substrate and electrically connected to the solid state imaging element; and a translucent substrate fixed on the substrate.

2. The solid state imaging device according to claim 1, wherein the first impurity layer is an amorphous layer.

3. The solid state imaging device according to claim 1, wherein
the substrate is a P-type silicon substrate, and
the first impurity layer is an N-type impurity layer formed by injecting germanium ions to the P-type silicon substrate.

4. The solid state imaging device according to claim 1, wherein
the substrate is an N-type silicon substrate, and
the first impurity layer is a P-type impurity layer formed by injecting arsenic ions to the N-type silicon substrate.

5. The solid state imaging device according to claim 1, wherein the first impurity layer is formed on the back surface of the substrate.

6. The solid state imaging device according to claim 1, wherein the first impurity layer is formed inside the substrate.

7. The solid state imaging device according to claim 1, further comprising a second impurity layer formed inside the substrate and having the same conductivity as the first impurity layer.

8. The solid state imaging device according to claim 7, wherein
the substrate is a P-type silicon substrate, and
the second impurity layer is an N-type impurity layer formed by injecting boron ions to the P-type silicon substrate.

9. The solid state imaging device according to claim 7, wherein
the substrate is an N-type silicon substrate, and
the second impurity layer is a P-type impurity layer formed by injecting phosphorous ions to the N-type silicon substrate.

10. The solid state imaging device according to claim 7, wherein the second impurity layer is formed on the first impurity layer.

11. The solid state imaging device according to claim 7, wherein the second impurity layer is formed above the first impurity layer.

12. The solid state imaging device according to claim 1, wherein
the substrate is a substrate including a plurality of through-holes, and
a ground wiring for electrically connecting the solid state imaging element and the plurality of external electrodes and for grounding the solid state imaging element is formed on side surfaces of some of the plurality of through-holes.

* * * * *